(12) United States Patent
Manipatruni et al.

(10) Patent No.: US 11,594,624 B2
(45) Date of Patent: Feb. 28, 2023

(54) TRANSISTOR STRUCTURES FORMED WITH 2DEG AT COMPLEX OXIDE INTERFACES

(71) Applicant: Intel Corporation, Santa Clara, CA (US)

(72) Inventors: Sasikanth Manipatruni, Portland, OR (US); Dmitri Nikonov, Beaverton, OR (US); Chia-Ching Lin, Portland, OR (US); Tanay Gosavi, Hillsboro, OR (US); Uygar Avci, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 930 days.

(21) Appl. No.: 16/218,892

(22) Filed: Dec. 13, 2018

(65) Prior Publication Data

US 2020/0194576 A1 Jun. 18, 2020

(51) Int. Cl.
*H01L 29/778* (2006.01)
*H01L 29/06* (2006.01)
*H01L 29/24* (2006.01)
*H01L 29/423* (2006.01)

(52) U.S. Cl.
CPC ........ *H01L 29/778* (2013.01); *H01L 29/0669* (2013.01); *H01L 29/24* (2013.01); *H01L 29/42316* (2013.01)

(58) Field of Classification Search
CPC ... H01L 29/778; H01L 29/0669; H01L 29/24; H01L 29/42316; H01L 29/42392; H01L 29/78696; H01L 29/0673; H01L 29/42356; H01L 29/512; H01L 29/66439; H01L 29/0657; H01L 21/02197; H01L 29/66795–66818; H01L 29/785–7856; H01L 29/04–045; B82Y 10/00
See application file for complete search history.

(56) References Cited

U.S. PATENT DOCUMENTS

| | | | |
|---|---|---|---|
| 2017/0133486 A1* | 5/2017 | Zhou | H01L 21/823807 |
| 2017/0352539 A1* | 12/2017 | Yang | H01L 21/28194 |
| 2020/0006516 A1* | 1/2020 | Manipatruni | H01L 29/517 |
| 2021/0280718 A1* | 9/2021 | Matsubayashi | H01L 27/105 |
| 2022/0037534 A1* | 2/2022 | Yamazaki | H01L 27/1225 |

* cited by examiner

*Primary Examiner* — Shahed Ahmed
(74) *Attorney, Agent, or Firm* — Schwabe, Williamson & Wyatt, P.C.

(57) ABSTRACT

Embodiments disclosed herein include transistor devices with complex oxide interfaces and methods of forming such devices. In an embodiment, the transistor device may comprise a substrate, and a fin extending up from the substrate. In an embodiment, a first oxide is formed over sidewall surfaces of the fin, and a second oxide is formed over the first oxide. In an embodiment, the first oxide and the second oxide are perovskite oxides with the general formula of $ABO_3$.

21 Claims, 9 Drawing Sheets

TRANSISTOR STRUCTURES FORMED WITH 2DEG AT COMPLEX OXIDE INTERFACES

TECHNICAL FIELD

Embodiments of the disclosure are in the field of semiconductor structures and processing and, in particular, transistor structures that utilize a two-dimensional electron gas (2DEG) that occurs at complex oxide interfaces.

BACKGROUND

III-V transistor devices have higher mobility channels than silicon devices. However, III-V transistors typically have poor subthreshold-slopes. Accordingly, research has begun to investigate the possibility of using complex oxide interfaces that result in a two-dimensional electron gas (2DEG). 2DEGs involve many-body interactions that give rise to a variety of physical phenomena such as superconductivity, magnetism, tunable metal-insulator transitions, and phase separation. Particularly, such 2DEGs have been shown to have steep subthreshold-slopes.

DESCRIPTION OF THE EMBODIMENTS

Embodiments described herein comprise semiconductor devices including 2DEGs formed at complex oxide interfaces and methods of forming such devices. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, complex oxide interfaces provide opportunities for forming semiconducting materials. Particularly, the complex oxide interface may be modulated from an insulating material to a conducting material by forming a two-dimensional electron gas (2DEG) at the interface between a first oxide and a second oxide. In an insulating mode (i.e., in an unbiased state) the complex oxide has a low density of electrons and is not able to conduct. In a conduction mode (i.e., in a biased state) the complex oxide has a high density of electrons that allows for a 2DEG to form and allows for conduction to occur. In embodiments disclosed herein, the modulation of such complex oxide interfaces is leveraged to form non-planar transistor devices. For example, complex oxide interfaces may be formed over a scaffold layer (e.g., a fin or a nanowire) to generate finFET devices or nanowire devices.

Figure 1A:
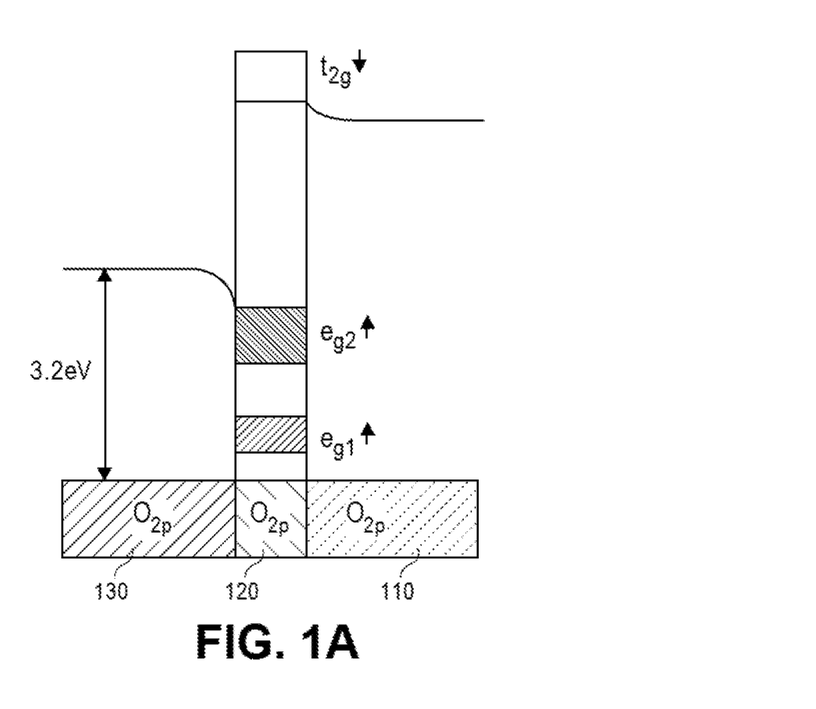
FIG. 1A is a band diagram of a complex oxide interface without a bias applied, in accordance with an embodiment.
Figure 1B:
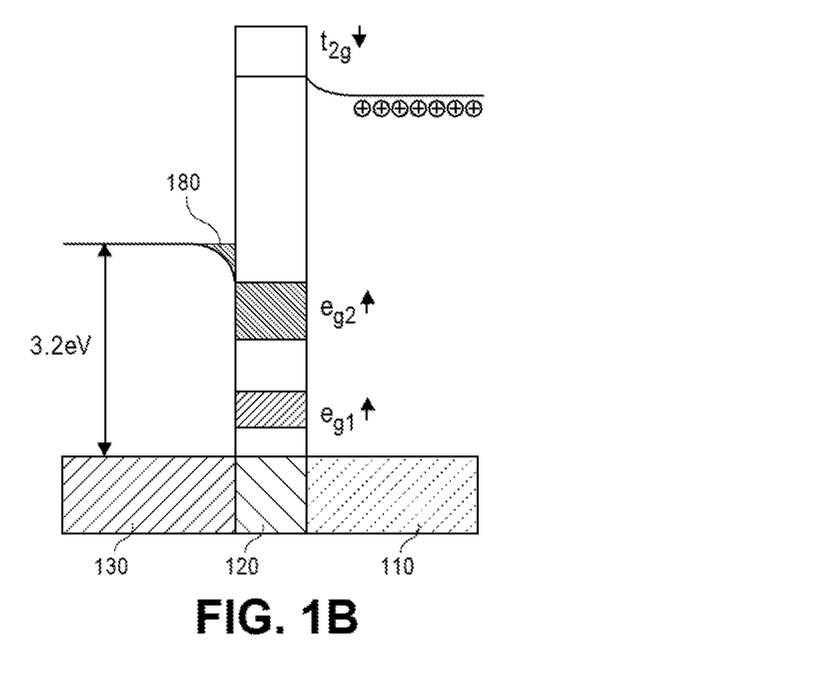
FIG. 1B is a band diagram of a complex oxide interface with a bias applied resulting in the formation of a 2DEG, in accordance with an embodiment.

Referring now to FIGS. 1A and 1B, band diagrams of a complex oxide interface in an insulating mode and a conducting mode are shown, respectively, in accordance with an embodiment. In the illustrated embodiment, the band diagrams illustrate the interface of a first complex oxide 120 and a second complex oxide 130. In an embodiment, the first complex oxide 120 may also interface with a scaffold layer 110. The scaffold layer may be a conductive or semiconductor material, such as silicon.

In an embodiment, the first complex oxide 120 and the second complex oxide 130 may be pervoskite oxides. For example, the first complex oxide 120 and the second complex oxide 130 may have the general formula of $ABO_3$. In some embodiments the radius of the A cation is larger than the radius of the B cation. In some embodiments, an A ion may be a rare earth or an alkali earth element and, in some embodiments, a B ion can be a transition metal. In an embodiment, the A ion may include Na, K, Rb, Cs, Ca, Sr, Ba, Y, La, Ce, Or, Nd, Sm, Eu, Gd, Tb, Dy, Ho, Er, Tm, Yb, Lu, Pu, Am, Ag, Cd, In, Tl, Pb, or Bi, and the B ion may include Li, Mg, Ca, Sr, Sc, Y, Ti, Zr, Hf, V, Nb, Ta, Cr, Mo, W, Mn, Tc, Fe, Ru, Co, Rh, Ir, Ni, Pd, Cu, Zn, Cd, Hg, Al, Ga, In, Ge, Sn, Pb, Sb, I, La, Ce, Pr, Nd, Sm, Eu, Gd, Tb, Dy, Ho, Er, Tm, Yb, Lu, Pn, or Am.

In an embodiment, the first complex oxide 120 and the second complex oxide 130 are polar mismatched oxides. That is, the first oxide has an A ion that has a different valence than an A ion of the second oxide. Table I has an exemplary list of possible combinations of the valence mismatches between the first oxide 120 and the second oxide 130 that may be suitable for forming complex oxide interfaces in accordance with embodiments described herein.

TABLE I

| First Oxide/Second Oxide |
| --- |
| $A^{2+}BO_3/A^{3+}BO_3$ |
| $A^{2+}BO_3/A^{4+}BO_3$ |
| $A^{2+}BO_3/A^{5+}BO_3$ |
| $A^{3+}BO_3/A^{2+}BO_3$ |
| $A^{3+}BO_3/A^{4+}BO_3$ |
| $A^{3+}BO_3/A^{5+}BO_3$ |
| $A^{4+}BO_3/A^{2+}BO_3$ |
| $A^{4+}BO_3/A^{3+}BO_3$ |
| $A^{4+}BO_3/A^{5+}BO_3$ |
| $A^{1+}BO_3/A^{2+}BO_3$ |
| $A^{1+}BO_3/A^{3+}BO_3$ |
| $A^{1+}BO_3/A^{4+}BO_3$ |
| $A^{1+}BO_3/A^{5+}BO_3$ |

A characteristic feature of complex oxides may include a possibility of a drastic change in the band structure of the material effected by the change of electron concentration or by the change in temperature. Referring back to the band diagram in FIG. 1A, an unbiased complex oxide interface is shown. As shown, the $O_{2p}$ bands are filled and the first e-band ($e_{g1}\uparrow$) is filled. However, the second e-band ($e_{g2}\uparrow$) is empty. Upon biasing the complex oxide (e.g., by applying a bias to a gate electrode over the interface, as will be described in greater detail below), the density of electrons in the interface is increased and the second e-band ($e_{g2}\uparrow$) is filled, as shown in FIG. 1B. Furthermore, excess electrons fill a well at the interface between the first oxide 120 and the second oxide 130 to form a 2DEG 180.

Figure 2:
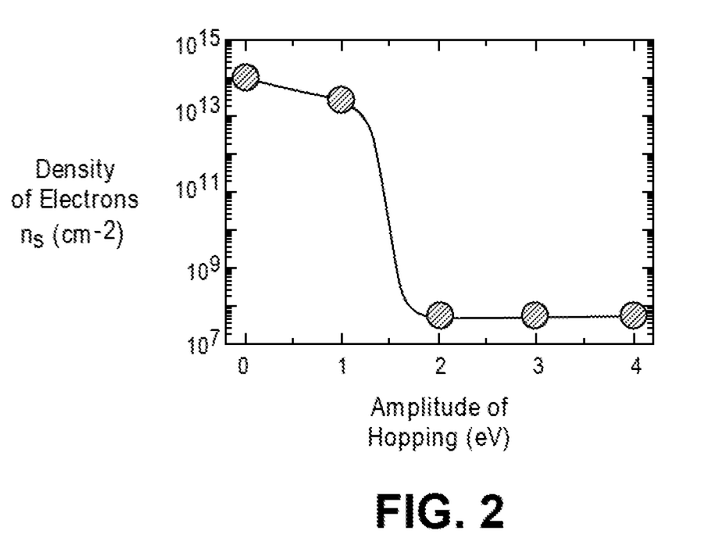
FIG. 2 is a chart illustrating the relationship between the density of electrons and the amplitude of hoping required to transition from an insulating material to a conductive material, in accordance with an embodiment.

FIG. 2 is a graph of electron density with respect to the electron hopping amplitude (in units of eV) in a complex oxide. The hopping amplitude is related to a probability of a transition of an electron from one cation to an oxygen anion and to another cation. This probability is dramatically affected by the presence of other electrons. The hopping amplitude is related to the width of a band, the mass of electrons in this band, and the speed of electrons in this band. At low electron hopping amplitudes, the oxide behaves as a conductive material, and when the electron hopping amplitude is larger the oxide can be viewed as insulating. As shown, when there is a high electron density (e.g., $10^{13}$ ns/cm$^2$ or greater when the interface is biased) the electron hopping amplitude is low (e.g., 1 eV or lower). A steep transition in the electron density occurs as the electron hopping amplitude increases to 2 eV. Accordingly, modulating the electron density by biasing the interface allows for a clear transition between an insulating and conductive condition.

Figure 3:
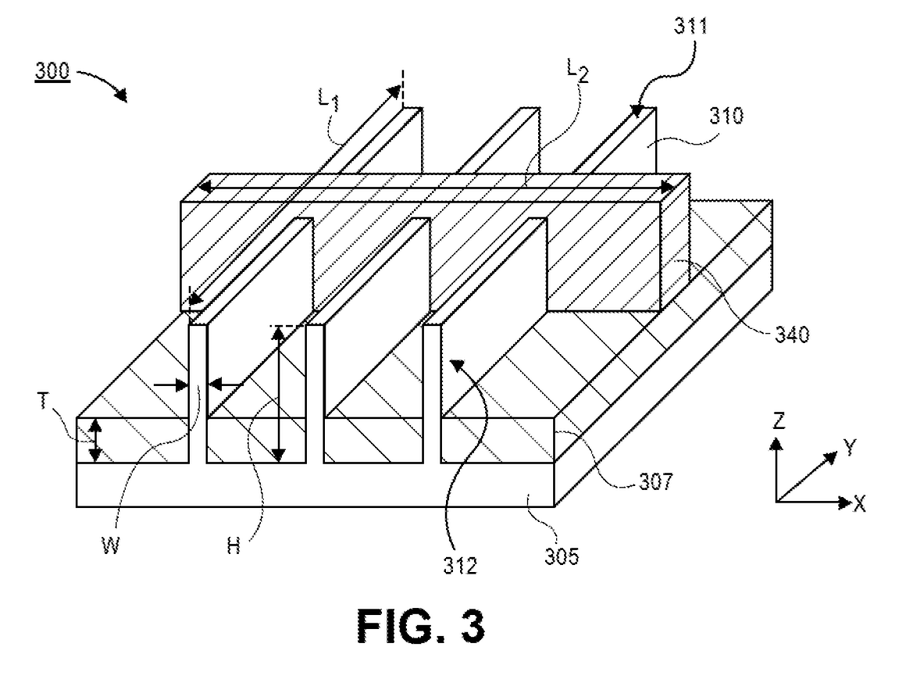
FIG. 3 is a perspective view illustration of a non-planar transistor device that implements a complex oxide interface in accordance with an embodiment.

Referring now to FIG. 3, a perspective view illustration of a transistor device 300 is shown, in accordance with an embodiment. In an embodiment, the transistor device 300 may comprise a substrate 305. In an embodiment, the substrate 305 may be a semiconductor material. In an embodiment, an substrate 305 represents a general workpiece object used to manufacture integrated circuits. The substrate 305 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, a plurality of fins 310 may be fabricated into the substrate 305. The fins 310 may be used as a scaffold onto which the complex oxide interface is formed. In the illustrated embodiment, the complex oxide interface is omitted for clarity. A detailed description of the complex oxide interface is provided in greater detail below with respect to FIGS. 4A-4C. In an embodiment, each of the fins 310 may be a high aspect ratio feature. That is a height (H) to width (W) ratio (H:W) may be 5:1, 10:1, 20:1, 50:1, or greater. In the illustrated embodiment, sidewalls 312 of the fins 310 are shown as being substantially vertical. However, it is to be appreciated that the fins 310 may have sloped or otherwise tapered sidewalls 312 depending on the method used to form the fins 310. In an embodiment, a top surface 311 of the fins 310 may be substantially planar. However, other embodiments may include top surfaces 311 of the fins 310 that are domed, or otherwise non-planar surfaces.

In an embodiment, the plurality of fins 310 extend in a length direction $L_1$. As shown in FIG. 3, the length direction $L_1$ extends along the Y-direction. In an embodiment, the plurality of fins 310 may each be substantially parallel to each other. In an embodiment, the plurality of fins 310 may have a uniform pitch. In other embodiments, the plurality of fins 310 may have a non-uniform pitch. While three fins 310 are shown in FIG. 3, it is to be appreciated that embodiments may include as few as one fin 310 or two or more fins 310.

In an embodiment, an isolation layer 307 may be formed over the substrate 305 and between the fins 310. For example, the isolation layer 307 may be considered a shallow trench isolation (STI) layer. In an embodiment, the isolation layer 307 may be an oxide, such as a silicon oxide. In an embodiment, the isolation layer 307 may have a thickness T. The thickness T may be less than the height H of the fins 310. Accordingly, a portion of the fins 310 extend up above a top surface of the isolation layer 307.

In an embodiment, a gate electrode 340 may be formed over the fins 310. In an embodiment, the gate electrode 340 may extend in a length direction $L_2$. The length direction $L_2$ may be substantially perpendicular to the length direction $L_1$ of the fins 310. For example, in FIG. 3, the length direction $L_2$ is primarily along the X-direction. In some embodiments, a single gate electrode 340 may extend over a plurality of fins 310. For example, in FIG. 3 a single gate electrode 340 extends over three fins 310. However, it is to be appreciated that a gate electrode 340 may extend over a single fin 310 or over two or more fins 310 in accordance with various embodiments.

In an embodiment, the gate electrode 340 may wrap around more than one surface of the plurality of fins 310 to form a non-planar transistor device. For example, the gate electrode 340 may extend over sidewall surfaces 311 and the top surface 312 of the fins 310. Such a configuration may be considered a tri-gate transistor or a fin-FET transistor. In the illustrated embodiment, the gate electrode 340 is shown as contacting the fins 310. However, it is to be appreciated that embodiments may include a complex oxide interface between the gate electrode 340 and the fins 310, as will be described in greater detail below with respect to FIGS. 4A-4C.

In the illustrated embodiment, source electrodes and drain electrodes are omitted in order to not obscure embodiments disclosed herein. However, it is to be appreciated that source and drain electrodes may be positioned over opposite ends of each fin 310 bisected by the gate electrode 340. That is, a source electrode may be positioned over a first end of the fin 310, a gate electrode 340 may be positioned over a central portion of the fin, and a drain electrode may be positioned over a second end of the fin 310 opposite from the first end of the fin 310.

In an embodiment, the gate electrode 340, the source electrode, and the drain electrode may comprise any suitable conductive material. In a particular embodiment, the electrodes may be a material suitable for forming a low-resistance contact. Since the electrodes contact the complex oxide (which has high density-of-states located at lower energies) the electrodes may comprise a high work-function material. For example, the electrodes may comprise one or more of Ni, Co, Ir, and Au. In an embodiment, the electrodes may comprise a high work-function material and a fill material of one or more conductive materials over the high work-function material.

Figure 4A:
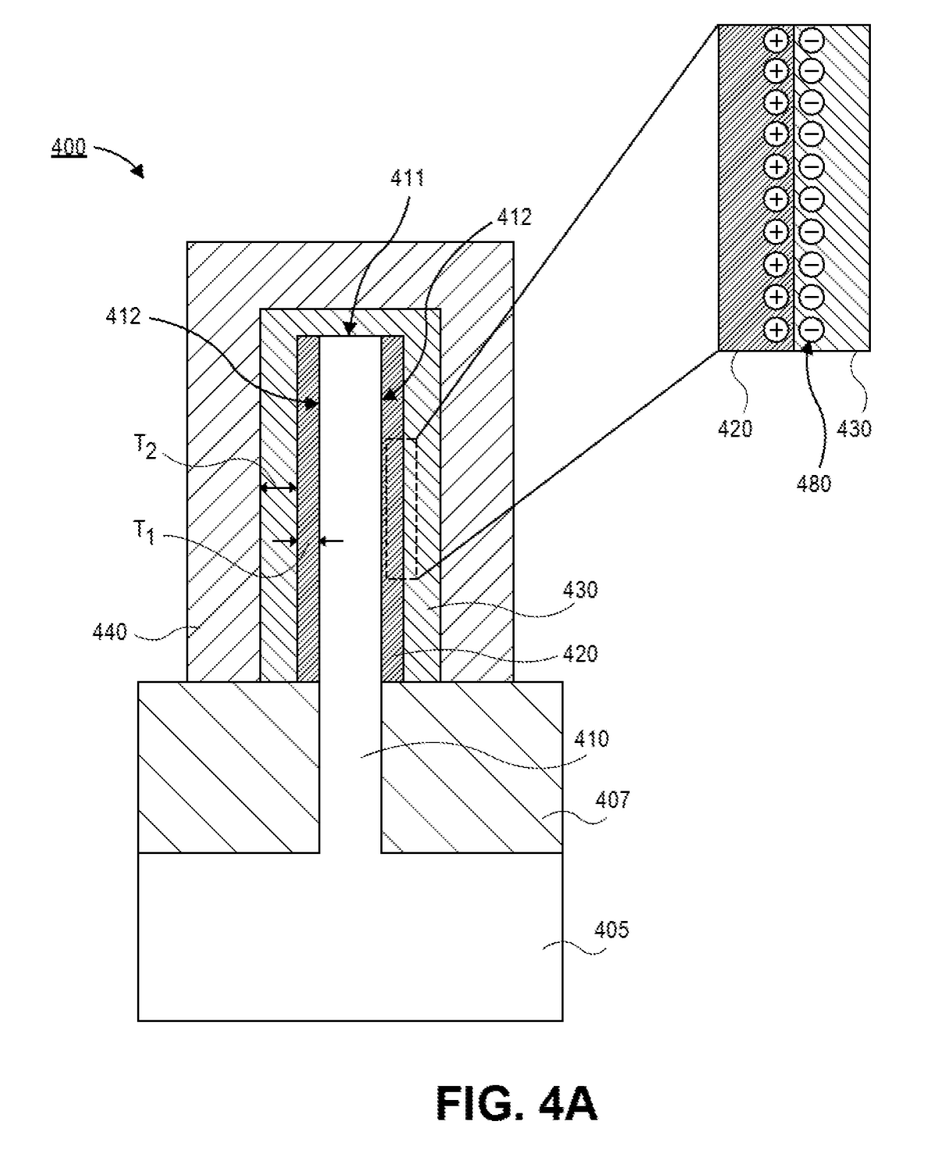
FIG. 4A is a cross-sectional illustration of a non-planar transistor device that implements a complex oxide interface, in accordance with an embodiment.
Figure 4B:
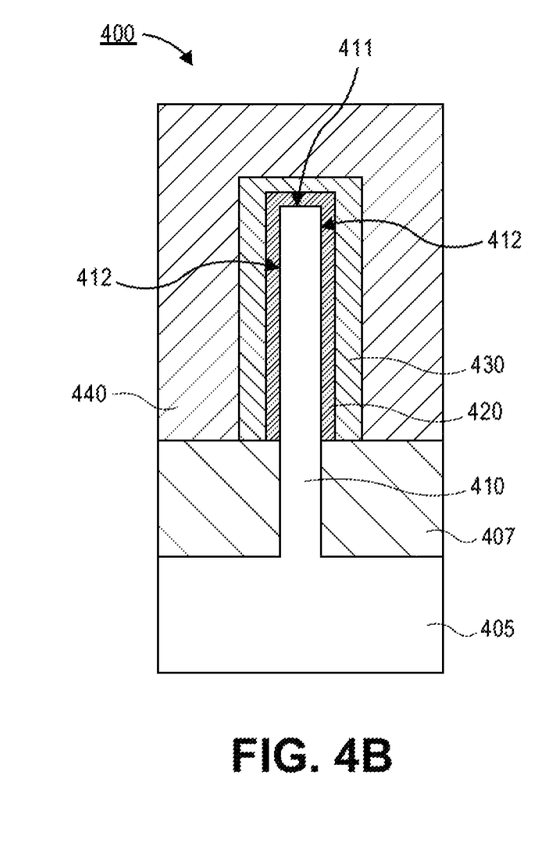
FIG. 4B is a cross-sectional illustration of a non-planar transistor device that includes a first oxide over sidewalls and a top surface of a fin and a second oxide over the first oxide, in accordance with an embodiment.
Figure 4C:
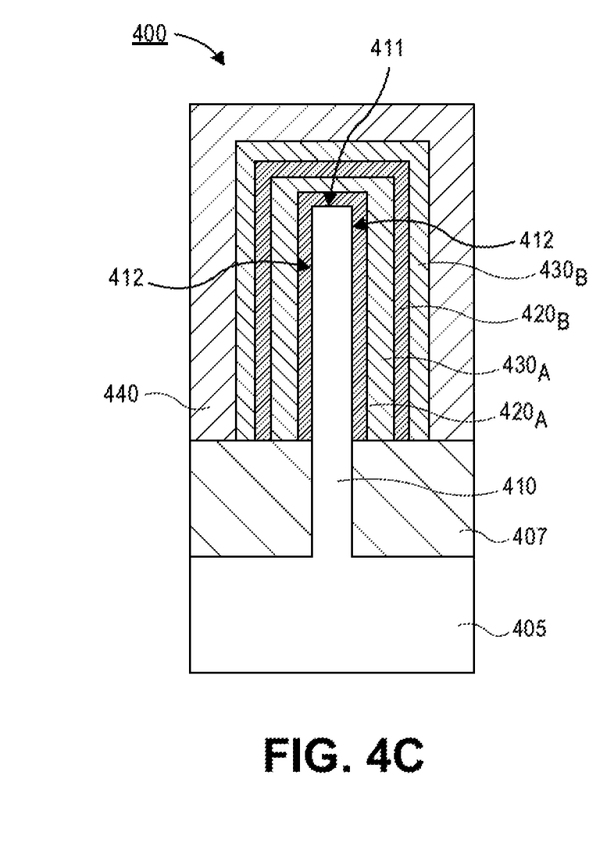
FIG. 4C is a cross-sectional illustration of a non-planar transistor device that includes a plurality of complex oxide interfaces, in accordance with an embodiment.

Referring now to FIGS. 4A-4C, cross-sectional illustrations of transistor devices 400 formed with complex oxide interfaces formed over fins are shown, in accordance with various embodiments. That is, the complex oxide interfaces may utilize the fin as a scaffold in order to obtain a desired shape. Accordingly, non-planar transistors may be fabricated using complex oxide interfaces.

Referring now to FIG. 4A, a cross-sectional illustration of a transistor device 400 with a complex oxide interface formed along sidewall surfaces 412 of the fin 410 is shown, in accordance with an embodiment. As illustrated, the complex oxide interface may comprise a first oxide 420 that is deposited over sidewall surfaces 412 of the fin 410 above the isolation layer 407 and the substrate 405. The first oxide 420 may be a perovskite oxide. In an embodiment, the first oxide 420 may be a perovskite oxide with a generic formula of $ABO_3$, such as oxides described above. In an embodiment, the first oxide 420 may have a thickness $T_1$. In an embodiment, the thickness $T_1$ may be one or two unit cells thick. In an embodiment, the thickness $T_1$ may be between approximately 1 nm and 10 nm.

In an embodiment, a second oxide 430 may be positioned over the first oxide 420. The second oxide 430 may directly contact portions of the first oxide 420 in order to form a complex oxide interface. In the illustrated embodiment, the second oxide 430 is positioned over the sidewalls 411 of the fin 410. That is, the second oxide 430 is separated from the sidewall surface 411 of the fin 410 by the first oxide 420. In an embodiment, the second oxide 430 may also wrap over the top surface 412 of the fin 410. In such an embodiment, a portion of the second oxide 430 may contact the top surface 412 of the fin 410 that is not covered by the first oxide 420. The second oxide 430 may be a perovskite oxide. In an embodiment, the second oxide 430 may be a perovskite oxide with a generic formula of $ABO_3$, such as oxides described above. In an embodiment, the second oxide 430 may have an A ion with a different valence than an A ion of the first oxide 420. For example, the generic formulas of the first oxide 420 and the second oxide 430 may include A ions with valences such as those described above in Table I. In a particular embodiment, the first oxide 420 may be $LaMnO_3$ (LMO) and the second oxide 430 may be $SrTiO_3$ (STO).

In an embodiment, the second oxide 430 may have a thickness $T_2$. In an embodiment, the thickness $T_2$ may be one or two unit cells thick. In an embodiment, the thickness $T_2$ may be between approximately 1 nm and 10 nm. In an embodiment, the thickness $T_1$ of the first oxide 420 may be substantially the same as the thickness $T_2$ of the second oxide 430. In other embodiments, the thickness $T_1$ of the first oxide 420 may be different than the thickness $T_2$ of the second oxide 430.

In FIG. 4A, the dashed box along the interface between the first oxide 420 and the second oxide 430 is zoomed in to illustrate the formation of the 2DEG 480. As shown in the zoomed in portion, a 2DEG 480 formed of a layer of electrons is formed in the second oxide 430 proximate to the interface with the first oxide 420. In an embodiment, a corresponding excess of holes (i.e., positive charge) is formed in the first oxide 420 proximate to the interface. In an embodiment, the 2DEG 480 is present proximate to the interface between the first oxide 420 and the second oxide 430 when the gate electrode 440 is biased. When the 2DEG 480 is formed, the channel is in a conducting mode. When the gate electrode 440 is unbiased, the 2DEG is not present and an insulating mode is obtained.

In FIG. 4A, the gate electrode 440 is shown wrapping around the complex oxide interface. That is, the gate electrode 440 is separated from the fin 410 by the first oxide 420 and the second oxide 430. Particularly, in the illustrated embodiment, the gate electrode 440 is separated from sidewalls 412 of the fin 420 by the first oxide 420 and the second oxide 430, and the gate electrode 440 is separated from the top surface 411 of the fin 410 by the second oxide 430.

Referring now to FIG. 4B, a cross-sectional illustration of a transistor 400 with a complex oxide interface that wraps completely around a fin 410 is shown, in accordance with an embodiment. In an embodiment, the transistor 400 illustrated in FIG. 4B may be substantially the same as the transistor 400 illustrated in FIG. 4A, with the exception that the first oxide 420 is formed along the sidewalls 412 of the fin 410 and the top surface 411 of the fin 410. Such an embodiment may be referred to as a tri-gate transistor since the channel is formed along three sides of the fin 410.

Referring now to FIG. 4C a cross-sectional illustration of a transistor 400 with a multi-layer complex oxide interface is shown, in accordance with an embodiment. In an embodiment, the transistor 400 illustrated in FIG. 4C may be substantially similar to the transistor 400 illustrated in FIG. 4B, with the exception that there are a plurality of complex oxide interfaces formed over the fin 410. Particularly, a first complex oxide interface may comprise a first oxide 420A and a second oxide 420B. The first oxide 420A and the second oxide 420B may be substantially similar to first oxide 420 and second oxide 430 illustrated in FIG. 4B. In an embodiment, the second complex oxide interface may comprise the interface between the second oxide 430A and a third oxide 420B. In an embodiment, a third complex oxide interface may comprise the interface between the third oxide 420B and a fourth oxide 430B. The third oxide 420B and the fourth oxide 430B may be perovskite oxides with the general formula $ABO_3$, such as oxides described above. In an embodiment, each complex oxide interface may comprise oxides with different valences, such as shown in Table I.

In an embodiment, the third oxide 420B may be the same material as the first oxide 420A, and the fourth oxide 430B may be the same material as the second oxide 430A. In other embodiments, the first oxide 420A and the third oxide 420B may be different materials, and the second oxide 430A and the fourth oxide 430B may be different materials. While three complex oxide interfaces are shown in FIG. 4C, it is to be appreciated that embodiments include any number of complex oxide interfaces.

Figure 5:
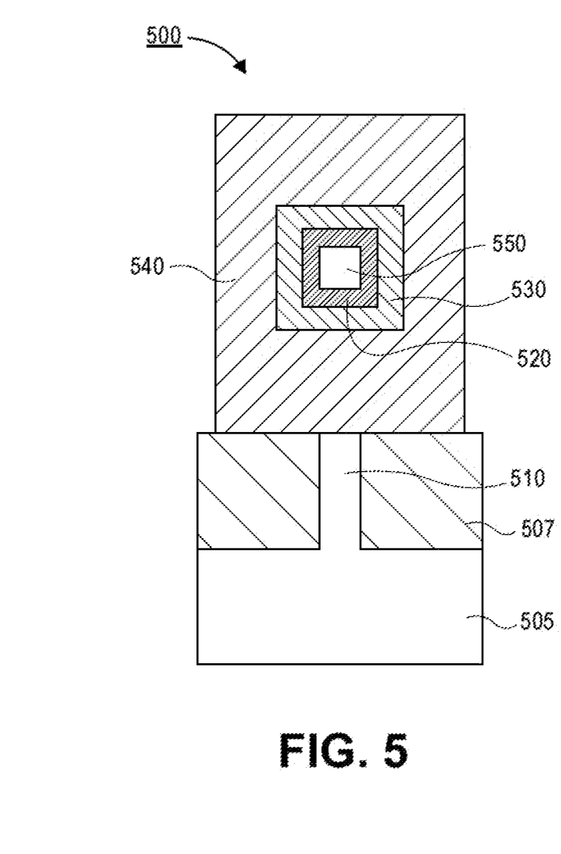
FIG. 5 is a cross-sectional illustration of a nanowire transistor that includes a complex oxide interface, in accordance with an embodiment.

Referring now to FIG. 5, a cross-sectional illustration of a transistor 500 that includes a nanowire device is shown, in accordance with an embodiment. In an embodiment, the transistor 500 may include a nanowire 550 that serves as a scaffold onto which the complex oxide interface is deposited. The nanowire 550 may span between a first fin and a second fin (out of plane of FIG. 5). The nanowire 550 may be formed with processes typically known in the art. For example, the nanowire 550 may be detached from the fin 510 with etching processes (e.g., using sacrificial layers or the like). The nanowire 550 may be positioned above the isolation layer 507 and the substrate 505.

In an embodiment, a first oxide 520 may wrap around the nanowire 550. That is, the first oxide 520 may completely surround the surfaces of the nanowire 550. The first oxide 520 may be a perovskite oxide with the general formula of $ABO_3$, such as oxides described above. In an embodiment, a second oxide 530 may wrap around the first oxide 520. That is, the second oxide 520 may completely surround the surfaces of the first oxide 530. The second oxide 530 may be a perovskite oxide with the general formula of $ABO_3$, such as described above. In an embodiment, the first oxide 520 and the second oxide 530 may have A ions that have different valences, such as a combination described above with respect to Table I.

In an embodiment, a gate electrode 540 may wrap around the second oxide 530. That is, the gate electrode 540 may completely surround the surface of the second oxide 530. Such a configuration may sometimes be referred to as a gate all around transistor or a nanowire transistor.

Referring now to FIGS. 6A-6E, a series of cross-sectional illustrations that depict a process for forming a non-planar transistor with a complex oxide interface is shown, in accordance with an embodiment.

Figure 6A:
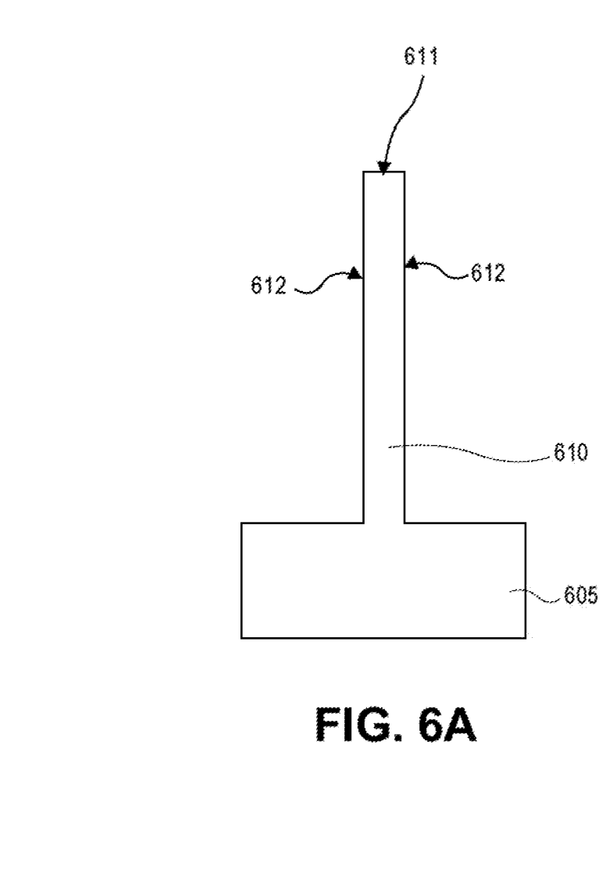
FIG. 6A is a cross-sectional illustration of a processing operation for forming a non-planar transistor device that includes forming a fin in a substrate, in accordance with an embodiment.

Referring now to FIG. 6A, a cross-sectional illustration of a fin 610 that extends up from a substrate 605 is shown, in accordance with an embodiment. In an embodiment, the fin 610 and the substrate 605 may be comprise any suitable material. For example, the fin 610 and the substrate 605 may comprise silicon, a III-V semiconductor material system, or any other suitable material system. The substrate 605 may be a single crystalline wafer, a silicon on insulator (SOI), a polycrystalline material, or the like.

In an embodiment, the fin 610 may be formed with an etching process, such as a dry etching process suitable for forming high aspect ratio features. The fin 610 may comprise sidewalls 612 and a top surface 611. Depending on the process used to fabricate the fin 610, the sidewalls 612 may be substantially vertical or have a tapered profile. In an embodiment, the top surface 611 of the fin 610 may be substantially flat, or the top surface 611 may have a domed or otherwise non-planar shape. While a single fin 610 is shown, it is to be appreciated that a plurality of fins 610 may be fabricated in parallel in order to form a plurality of non-planar transistors devices with complex oxide interfaces.

Figure 6B:
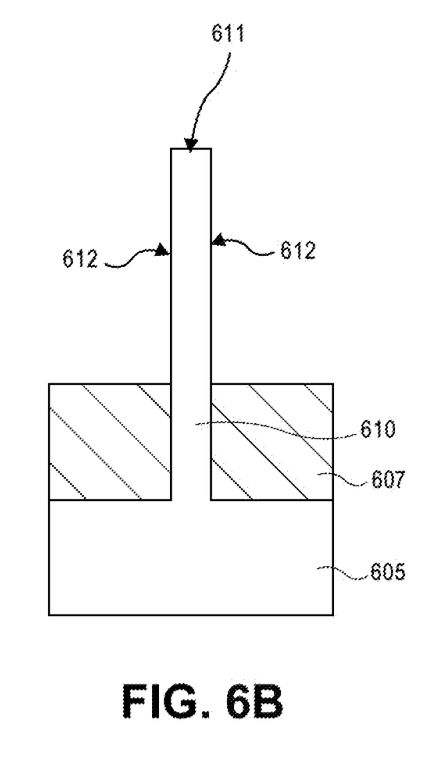
FIG. 6B is a cross-sectional illustration of a processing operation for forming a non-planar transistor device that includes forming an insulating layer around a base of the fin, in accordance with an embodiment.

Referring now to FIG. 6B, a cross-sectional illustration after an isolation layer 607 is deposited is shown, in accordance with an embodiment. In an embodiment, the isolation layer 607 may be an oxide, such as silicon oxide. The isolation layer 607 may be deposited with any suitable deposition process known in the art.

Figure 6C:
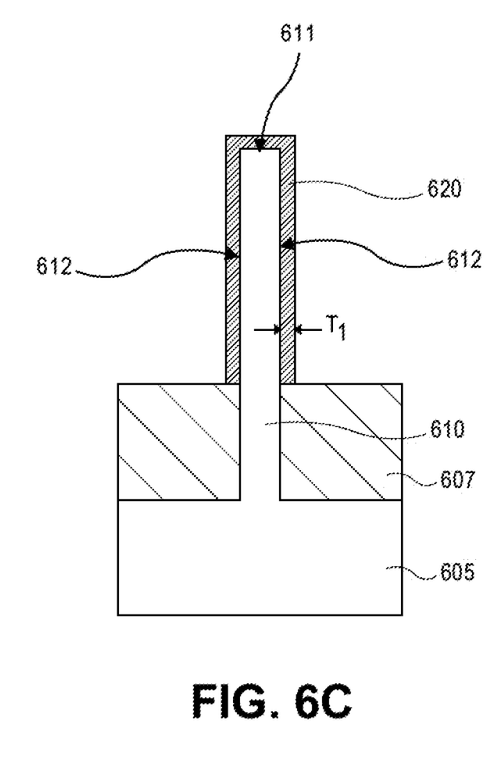
FIG. 6C is a cross-sectional illustration of a processing operation for forming a non-planar transistor device that includes forming a first oxide layer over exposed surfaces of the fin, in accordance with an embodiment.

Referring now to FIG. 6C, a cross-sectional illustration after a first oxide 620 is deposited over the fin 610 is shown, in accordance with an embodiment. In an embodiment, the first oxide 620 is a perovskite oxide with the general formula $ABO_3$, such as one of the oxides described above. In an embodiment, the first oxide 620 may be deposited with a deposition process suitable for forming thin conformal layers. For example, the first oxide 620 may be deposited with a molecular beam epitaxy (MBE) process or a metal organic chemical vapor deposition (MOCVD) process. In an embodiment, the first oxide 620 may have a thickness $T_1$ that is one to two unit cells thick. In an embodiment, the first oxide 620 may have a thickness $T_1$ that is between approximately 1 nm and 10 nm. The conformal deposition of the first oxide 620 allows for the first oxide 620 to conform to the sidewalls 612 and the top surface 611 of the fin 610.

Figure 6D:
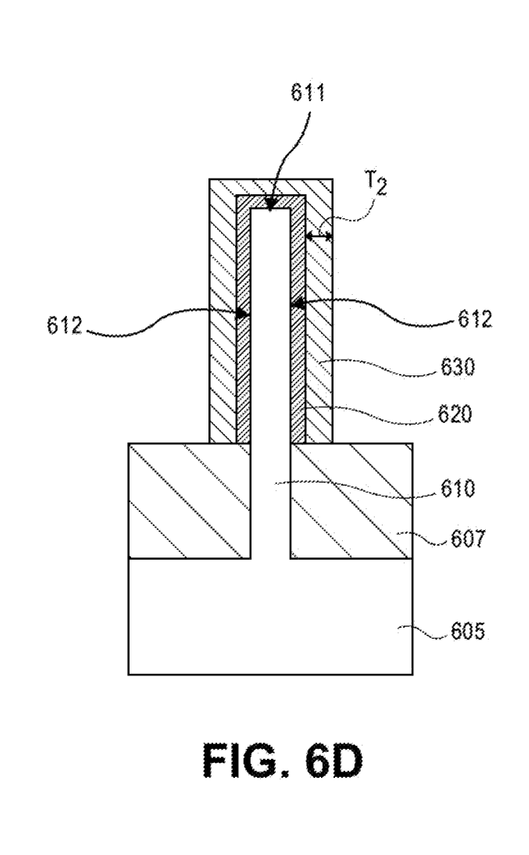
FIG. 6D is a cross-sectional illustration of a processing operation for forming a non-planar transistor device that includes forming a second oxide layer over the first oxide layer, in accordance with an embodiment.

Referring now to FIG. 6D, a cross-sectional illustration after a second oxide 630 is deposited over the first oxide 620 to form a complex oxide interface is shown, in accordance with an embodiment. In an embodiment, the second oxide 630 is a perovskite oxide with the general formula $ABO_3$, such as one of the oxides described above. In an embodiment, the second oxide 630 may be deposited with a deposition process suitable for forming thin conformal layers. For example, the second oxide 630 may be deposited with an MBE process or an MOCVD process. In an embodiment, the second oxide 630 may have a thickness $T_2$ that is one to two unit cells thick. In an embodiment, the second oxide 630 may have a thickness $T_2$ that is between approximately 1 nm and 10 nm. In an embodiment, the first oxide thickness $T_1$ and the second oxide thickness $T_2$ may be substantially the same. In other embodiments, the first oxide thickness $T_1$ and the second oxide thickness $T_2$ may be different. As shown in FIG. 6D, the second oxide 630 may cover the exposed surfaces of the first oxide 620.

Figure 6E:
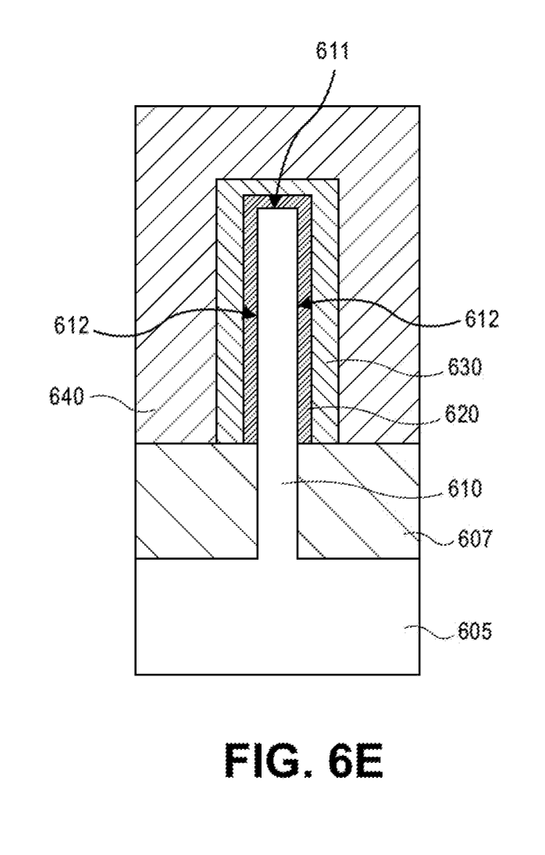
FIG. 6E is a cross-sectional illustration of a processing operation for forming a non-planar transistor device that includes forming a gate electrode over the second oxide layer, in accordance with an embodiment.

Referring now to FIG. 6E, a cross-sectional illustration after a gate electrode 640 is deposited over the second oxide 630 is shown, in accordance with an embodiment. In an embodiment, the gate electrode 640 may be deposited with any suitable deposition process, such as chemical vapor deposition (CVD), physical vapor deposition (PVD), or the like. In an embodiment, the gate electrode 640 may comprise a high work-function material, such as one or more of Ni, Co, Ir, and Au. In an embodiment, the gate electrode 640 may comprise a high work-function material in direct contact with the second oxide 630 and a conductive fill material over the high work-function material. As shown in FIG. 6E, the gate electrode wraps around the fin 610. Particularly, embodiments include a gate electrode 640 that extends along sidewall surfaces 612 of the fin 610 and over a top surface 611 of the fin. Accordingly, such a transistor device may be considered a tri-gate transistor or a fin-FET transistor.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
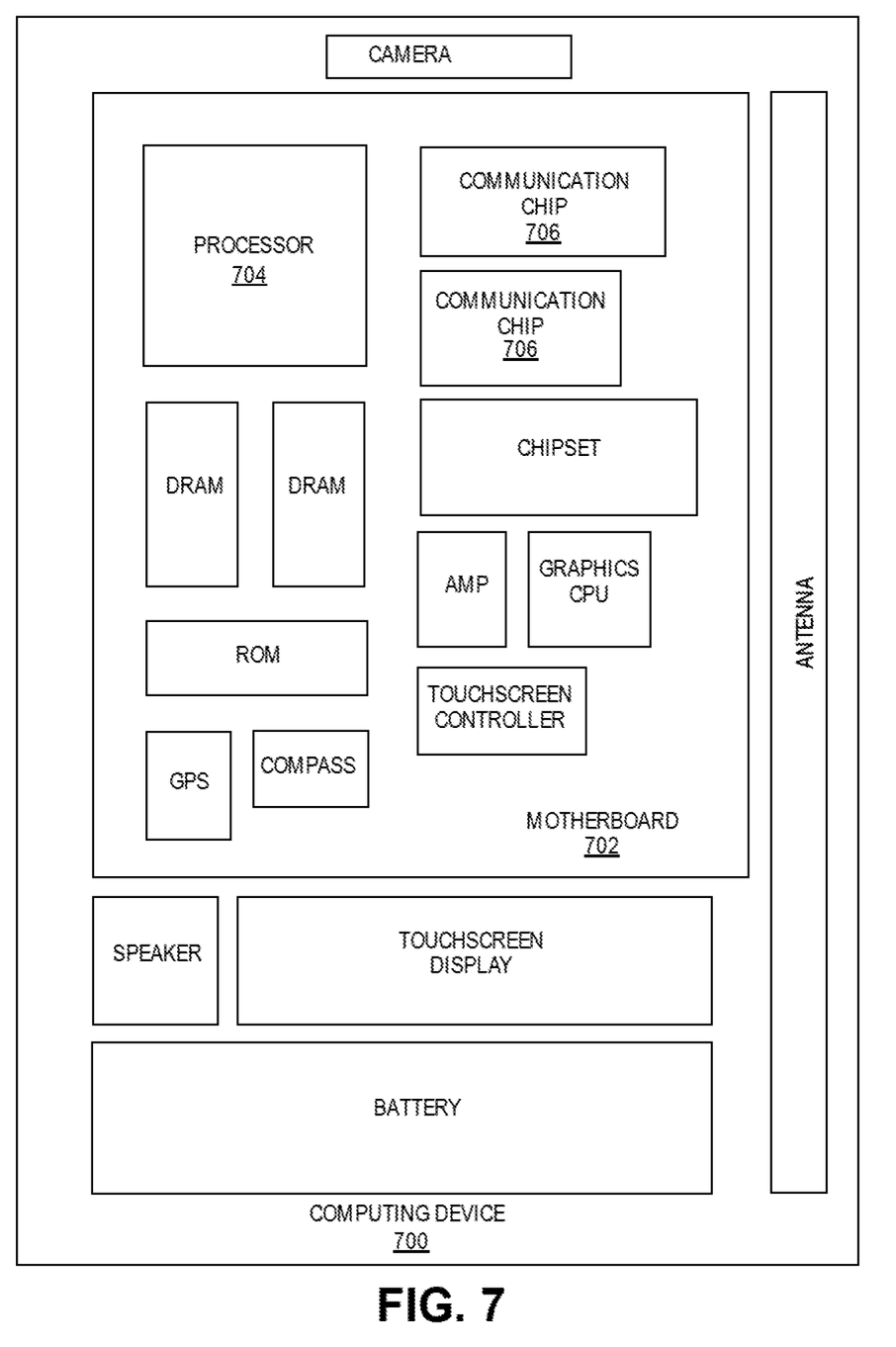
FIG. 7 illustrates a computing device in accordance with one implementation of an embodiment of the disclosure.

FIG. 7 illustrates a computing device 700 in accordance with one implementation of an embodiment of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In an embodiment, the integrated circuit die of the processor includes a non-planar transistor comprising a complex oxide interface, as described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In an embodiment, the integrated circuit die of the communication chip includes a non-planar transistor comprising a complex oxide interface, as described herein.

In further implementations, another component housed within the computing device 700 may contain an integrated circuit die that includes a non-planar transistor comprising a complex oxide interface, as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
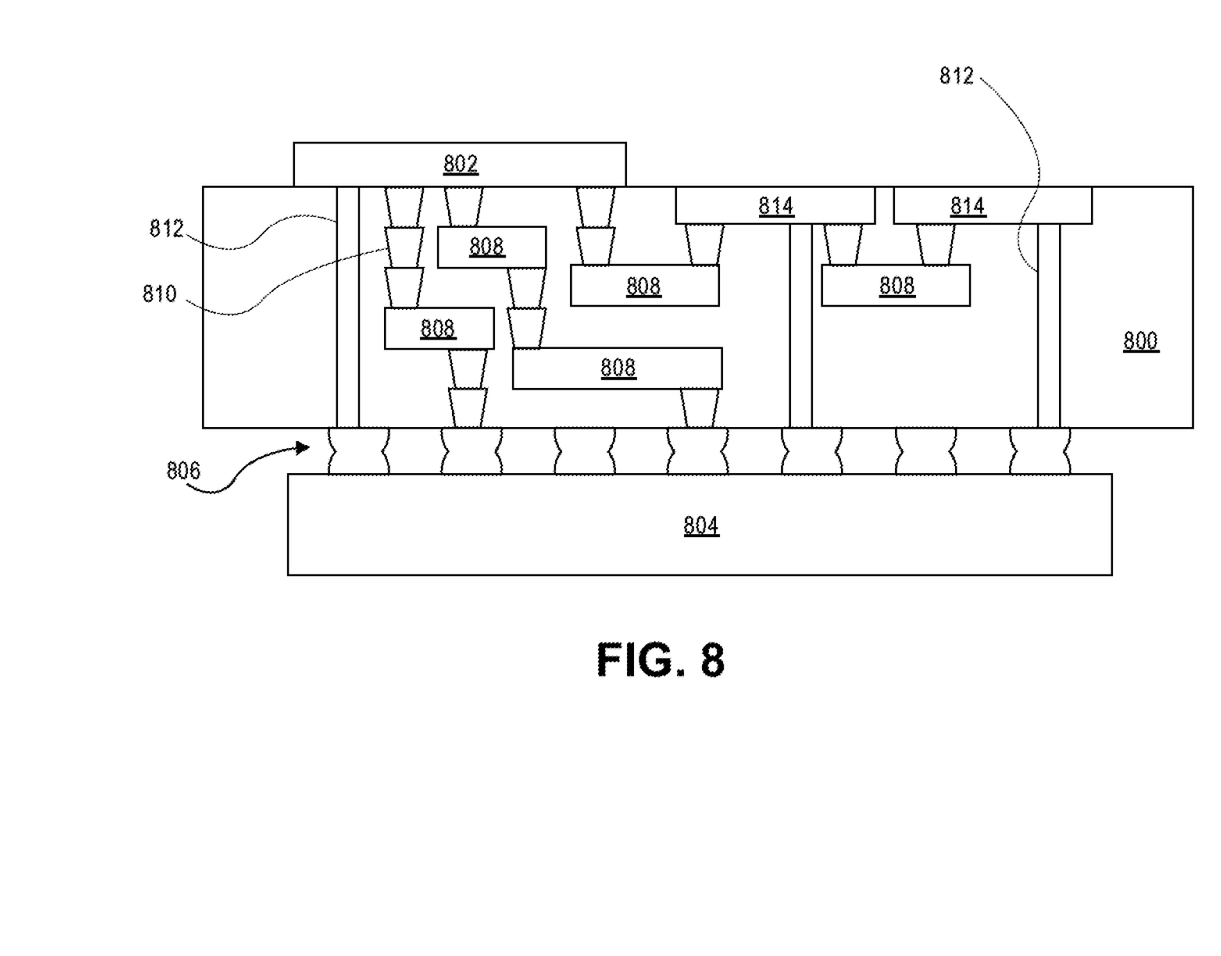
FIG. 8 is an interposer implementing one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments of the present disclosure include a non-planar transistor comprising a complex oxide interface, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a transistor device, comprising: a substrate; a fin extending up from the substrate; a first oxide over sidewall surfaces of the fin; and a second oxide over the first oxide, wherein the first oxide and the second oxide are perovskite oxides with the general formula of $ABO_3$.

Example 2: the transistor device of Example 1, wherein the A ion of the first oxide differs in valence with the A ion of the second oxide.

Example 3: the transistor device of Example 1 or Example 2, wherein the A ion of the first oxide has a valence of 2 and the A ion of the second oxide has a valence of 3, 4, or 5.

Example 4: the transistor device of Examples 1-3, wherein the A ion of the first oxide has a valence of 3 and the A ion of the second oxide has a valence of 2, 4, or 5.

Example 5: the transistor device of Examples 1-4, wherein the A ion of the first oxide has a valence of 4 and the A ion of the second oxide has a valence of 2, 3, or 5.

Example 6: the transistor device of Examples 1-5, wherein the A ion of the firs oxide has a valence of 1 and the A ion of the second oxide has a valence of 2, 3, 4, or 5.

Example 7: the transistor device of Examples 1-6, wherein the first oxide is $SrTiO_3$ and the second oxide is $LaMnO_3$.

Example 8: the transistor device of Examples 1-7, wherein the second oxide contacts a top surface of the fin.

Example 9: the transistor device of Examples 1-8, wherein the first oxide is further formed over a top surface of the fin.

Example 10: the transistor device of Examples 1-9, wherein the fin is a Si fin.

Example 11: the transistor device of Examples 1-10, further comprising: a third oxide over the second oxide; and a fourth oxide over the third oxide, wherein the third oxide is the same oxide as the first oxide and the fourth oxide is the same oxide as the second oxide.

Example 12: the transistor device of Examples 1-11, wherein the first oxide has a thickness between 1 nm and 10 nm, and wherein the second oxide has a thickness between 1 nm and 10 nm.

Example 13: the transistor device of Examples 1-12, further comprising: a gate electrode over the second oxide, wherein the gate electrode extends along the sidewall surfaces and a top surface of the fin.

Example 14: the transistor device of Examples 1-13, wherein the gate electrode comprises a high work-function metal.

Example 15: the transistor device of Examples 1-14, wherein the gate electrode comprises one or more of Ni, Co, Ir, and Au.

Example 16: a semiconductor device, comprising: a substrate; a plurality of fins extending up from the substrate, wherein each of the fins comprise sidewall surfaces and a top surface, and wherein the plurality of fins each have a length that extends in a first direction substantially parallel to each other; a complex oxide interface over each of the fins, wherein the complex oxide interface comprises: a first complex oxide directly over the fin; and a second complex oxide directly over the first oxide, wherein the first complex oxide and the second complex oxide are perovskite oxides with the generic formula of $ABO_3$, and wherein the valence of the A ion of the first oxide is different than the valence of the A ion of the second oxide; and a gate electrode over the plurality of fins, wherein the gate electrode has a length that extends in a second direction that is substantially orthogonal to the first direction.

Example 17: the semiconductor device of Example 16, wherein the fins comprise Si.

Example 18: the semiconductor device of Example 16 or Example 17, wherein the first oxide is $SrTiO_3$ and the second oxide is $LaMnO_3$.

Example 19: the semiconductor device of Examples 16-18, further comprising a source electrode and a drain electrode, wherein the drain electrode is over a first end of the fins and the drain electrode is over a second end of the fins, and wherein the gate electrode is between the source electrode and the drain electrode.

Example 20: the semiconductor device of Examples 16-19, wherein the gate electrode comprises one or more of Ni, Co, Ir, and Au.

Example 21: the semiconductor device of Examples 16-20, wherein the first oxide has a thickness between 1 nm and 10 nm, and wherein the second oxide has a thickness between 1 nm and 10 nm.

Example 22: a transistor device, comprising: a substrate; a first fin extending up from the substrate; a second fin extending up from the substrate; a nano wire connecting the first fin to the second fin; a first oxide surrounding surfaces of the nanowire; a second oxide over the first oxide, wherein the first oxide and the second oxide are perovskite oxides with the general formula of $ABO_3$; and a gate electrode surrounding the second oxide.

Example 23: the transistor device of Example 22, wherein the first oxide has a thickness between 1 nm and 10 nm, and wherein the second oxide has a thickness between 1 nm and 10 nm.

Example 24: a computing device, comprising: a motherboard; an integrated circuit die coupled to the motherboard; wherein the integrated circuit die, comprises: a substrate; a plurality of fins extending up from the substrate, wherein each of the fins comprise sidewall surfaces and a top surface, and wherein the plurality of fins each have a length that extends in a first direction substantially parallel to each other; a complex oxide interface over each of the fins, wherein the complex oxide interface comprises: a first complex oxide directly over the fin; and a second complex oxide directly over the first oxide, wherein the first complex oxide and the second complex oxide are perovskite oxides with the generic formula of $ABO_3$, and wherein the valence of the A ion of the first oxide is different than the valence of the A ion of the second oxide; and a gate electrode over the plurality of fins, wherein the gate electrode has a length that extends in a second direction that is substantially orthogonal to the first direction.

Example 25: the computing device of Example 24, wherein the computing device is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

What is claimed is:
1. A transistor device, comprising:
a substrate;
a fin extending up from the substrate;
a first oxide over sidewall surfaces of the fin; and
a second oxide over the first oxide, wherein the first oxide and the second oxide are perovskite oxides with the general formula of $ABO_3$, wherein the A ion of the first oxide differs in valence with the A ion of the second oxide.

2. The transistor device of claim 1, wherein the A ion of the first oxide has a valence of 2 and the A ion of the second oxide has a valence of 3, 4, or 5.

3. The transistor device of claim 1, wherein the A ion of the first oxide has a valence of 3 and the A ion of the second oxide has a valence of 2, 4, or 5.

4. The transistor device of claim 1, wherein the A ion of the first oxide has a valence of 4 and the A ion of the second oxide has a valence of 2, 3, or 5.

5. The transistor device of claim 1, wherein the A ion of the firs oxide has a valence of 1 and the A ion of the second oxide has a valence of 2, 3, 4, or 5.

6. The transistor device of claim 1, wherein the first oxide is $SrTiO_3$ and the second oxide is $LaMnO_3$.

7. The transistor device of claim 1, wherein the second oxide contacts a top surface of the fin.

8. The transistor device of claim 1, wherein the first oxide is further formed over a top surface of the fin.

9. The transistor device of claim 1, wherein the fin is a Si fin.

10. The transistor device of claim 1, further comprising:
a third oxide over the second oxide; and
a fourth oxide over the third oxide, wherein the third oxide is the same oxide as the first oxide and the fourth oxide is the same oxide as the second oxide.

11. The transistor device of claim 1, wherein the first oxide has a thickness between 1 nm and 10 nm, and wherein the second oxide has a thickness between 1 nm and 10 nm.

12. The transistor device of claim 1, further comprising:
a gate electrode over the second oxide, wherein the gate electrode extends along the sidewall surfaces and a top surface of the fin.

13. The transistor device of claim 12, wherein the gate electrode comprises a high work-function metal.

14. The transistor device of claim 13, wherein the gate electrode comprises one or more of Ni, Co, Ir, and Au.

15. A semiconductor device, comprising:
a substrate;
a plurality of fins extending up from the substrate, wherein each of the fins comprise sidewall surfaces and a top surface, and wherein the plurality of fins each have a length that extends in a first direction substantially parallel to each other;
a complex oxide interface over each of the fins, wherein the complex oxide interface comprises:
a first complex oxide directly over the fin; and
a second complex oxide directly over the first oxide, wherein the first complex oxide and the second complex oxide are perovskite oxides with the generic formula of $ABO_3$, wherein the valence of the A ion of the first oxide is different than the valence of the A ion of the second oxide, and wherein the first oxide is $SrTiO_3$ and the second oxide is $LaMnO_3$; and
a gate electrode over the plurality of fins, wherein the gate electrode has a length that extends in a second direction that is substantially orthogonal to the first direction.

16. The semiconductor device of claim 15, wherein the fins comprise Si.

17. The semiconductor device of claim 15, further comprising a source electrode and a drain electrode, wherein the drain electrode is over a first end of the fins and the drain electrode is over a second end of the fins, and wherein the gate electrode is between the source electrode and the drain electrode.

18. The semiconductor device of claim 15, wherein the gate electrode comprises one or more of Ni, Co, Ir, and Au.

19. The semiconductor device of claim 15, wherein the first oxide has a thickness between 1 nm and 10 nm, and wherein the second oxide has a thickness between 1 nm and 10 nm.

20. A computing device, comprising:
a motherboard;
an integrated circuit die coupled to the motherboard; wherein the integrated circuit die, comprises:
a substrate;
a plurality of fins extending up from the substrate, wherein each of the fins comprise sidewall surfaces and a top surface, and wherein the plurality of fins each have a length that extends in a first direction substantially parallel to each other;
a complex oxide interface over each of the fins, wherein the complex oxide interface comprises:
a first complex oxide directly over the fin; and
a second complex oxide directly over the first oxide, wherein the first complex oxide and the second complex oxide are perovskite oxides with the generic formula of $ABO_3$, and wherein the valence of the A ion of the first oxide is different than the valence of the A ion of the second oxide, and wherein the first oxide is $SrTiO_3$ and the second oxide is $LaMnO_3$; and
a gate electrode over the plurality of fins, wherein the gate electrode has a length that extends in a second direction that is substantially orthogonal to the first direction.

21. The computing device of claim 20, wherein the computing device is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

* * * * *